US009634505B2

(12) United States Patent
Kono et al.

(10) Patent No.: US 9,634,505 B2
(45) Date of Patent: Apr. 25, 2017

(54) CHARGING AND DISCHARGING CONTROL DEVICE, CHARGING AND DISCHARGING CONTROL SYSTEM, CHARGING AND DISCHARGING CONTROL METHOD, AND PROGRAM

(71) Applicant: MITSUBISHI HEAVY INDUSTRIES, LTD., Minato-ku, Tokyo (JP)

(72) Inventors: Takayuki Kono, Tokyo (JP); Katsuaki Morita, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 155 days.

(21) Appl. No.: 14/424,855

(22) PCT Filed: Sep. 27, 2013

(86) PCT No.: PCT/JP2013/076343
§ 371 (c)(1),
(2) Date: Feb. 27, 2015

(87) PCT Pub. No.: WO2014/083930
PCT Pub. Date: Jun. 5, 2014

(65) Prior Publication Data
US 2015/0214761 A1 Jul. 30, 2015

(30) Foreign Application Priority Data
Nov. 28, 2012 (JP) .................................. 2012-259879

(51) Int. Cl.
H02J 7/00 (2006.01)
B60L 9/18 (2006.01)
(Continued)

(52) U.S. Cl.
CPC .............. *H02J 7/0052* (2013.01); *B60L 7/16* (2013.01); *B60L 9/18* (2013.01); *B60L 15/2045* (2013.01);
(Continued)

(58) Field of Classification Search
CPC ....... Y02E 60/12; H02J 7/0042; H02J 7/0045; H01M 10/46; H01M 10/44
(Continued)

(56) References Cited

U.S. PATENT DOCUMENTS

2003/0096158 A1* 5/2003 Takano ............... H01M 10/482
429/90
2003/0117112 A1* 6/2003 Chen ..................... H02J 7/0073
320/137

FOREIGN PATENT DOCUMENTS

CN 1767309 A 5/2006
JP 2002-058111 A 2/2002
(Continued)

OTHER PUBLICATIONS

China Patent Office, "Office Action for Chinese Patent Application No. 201380040148.1," Jul. 4, 2016.
(Continued)

Primary Examiner — Arun Williams
(74) Attorney, Agent, or Firm — Manabu Kanesaka; Benjamin Hauptman; Kenneth Berner

(57) ABSTRACT

Within a range of a second limit current (±I_adj_max) set based on the performance of a secondary battery (140), a charging and discharging control device (170) determines an upper limit value (I_adj_limit) or a lower limit value (−I_adj_limit) of a state of charge (SOC) adjustment current (I_adj) in accordance with load power (required power and regeneration power) of a vehicle (100). Using an adjustment logic determined based on these limit values of the SOC adjust-
(Continued)

ment current (I_adj), the charging and discharging control device (170) also determines the SOC adjustment current (I_adj) corresponding to an actually measured SOC value of the secondary battery (140).

10 Claims, 5 Drawing Sheets

(51) Int. Cl.
 *B60L 7/16* (2006.01)
 *B60L 15/20* (2006.01)
 *G01R 31/36* (2006.01)
(52) U.S. Cl.
 CPC ........ *G01R 31/3606* (2013.01); *H02J 7/0047* (2013.01); *H02J 7/0063* (2013.01); *B60L 2200/26* (2013.01); *H02J 2007/005* (2013.01); *H02J 2007/0067* (2013.01); *Y02T 10/645* (2013.01); *Y02T 10/72* (2013.01); *Y02T 10/7283* (2013.01)
(58) Field of Classification Search
 USPC .......................................................... 320/107
 See application file for complete search history.

(56) References Cited

FOREIGN PATENT DOCUMENTS

| | | |
|---|---|---|
| JP | 2003-018702 A | 1/2003 |
| JP | 2006-034041 A | 2/2006 |
| JP | 2006-340561 A | 12/2006 |
| JP | 2008-228420 A | 9/2008 |
| JP | 2009-089503 A | 4/2009 |
| JP | 2009-171772 A | 7/2009 |
| JP | 2009-273198 A | 11/2009 |
| JP | 2012-105407 A | 5/2012 |
| JP | 2013-123280 A | 6/2013 |

OTHER PUBLICATIONS

PCT/ISA/210, "International Search Report for PCT/JP2013/076343," Nov. 19, 2013.
PCT/ISA/237, "Written Opinion of the International Searching Authority for PCT/JP2013/076343," Nov. 19, 2013.
Japan Patent Office, "Notice of Allowance for Japanese Patent Application No. 2012-259879," Mar. 29, 2016.

\* cited by examiner

ADJUSTMENT LOGIC (P_load ≧ 0: POWERING TIME)

ADJUSTMENT LOGIC (P_load < 0: REGENERATION TIME)

CHARGING AND DISCHARGING CONTROL DEVICE, CHARGING AND DISCHARGING CONTROL SYSTEM, CHARGING AND DISCHARGING CONTROL METHOD, AND PROGRAM

RELATED APPLICATIONS

The present application is National Phase of International Application No. PCT/JP2013/076343 filed Sep. 27, 2013, and claims priority from Japanese Application No. 2012-259879, filed Nov. 28, 2012, the disclosure of which is hereby incorporated by reference herein in its entirety.

TECHNICAL FIELD

The present invention relates to a charging and discharging control device, a charging and discharging control system, a charging and discharging control method, and a program.

Priority is claimed on Japanese Patent Application No. 2012-259879, filed Nov. 28, 2012, the content of which is incorporated herein by reference.

BACKGROUND ART

For example, a vehicle, such as an electric train, in which a loaded power storage device is charged with regenerative power when powering is performed using power supplied from an overhead line and the regenerative power is generated through braking is known. The power required for the powering in this vehicle differs according to a travel environment such as a gradient of a railway or a travel time zone such as a rush-hour period or an off-hour period. Thus, when the power storage device is requested to supply the power required for the powering, a power amount of the requested power also varies.

Therefore, based on a power storage state of the power storage device, the power required for the powering is discharged by controlling a power value of charging/discharging of the power storage device and the power storage device is charged with the regenerative power (for example, see Patent Literature 1).

CITATION LIST

Patent Literature

[Patent Literature 1]
Japanese Unexamined Patent Application, First Publication No. 2006-34041

SUMMARY OF INVENTION

Technical Problem

However, when a power value of charging/discharging is controlled to be suitable for the condition of the power storage state of the power storage device, for example, when power greater than or equal to required power required by the load is discharged from the power storage device, the discharged power is transmitted to the overhead line. In addition, when the power required to charge the power storage device is greater than the regenerative power, supplied power from the overhead line is likely to be increased.

In this manner, when the power value of charging/discharging is controlled to be suitable for the condition of the power storage state of the power storage device, there is a problem in that power loss of charging/discharging for the power storage device is deteriorated.

According to an embodiment of the present invention, there are provided a charging and discharging control device, a charging and discharging control system, a charging and discharging control method, and a program for efficiently employing power in a moving object in which powering and regeneration are performed.

Solution to Problem

According to a first aspect of the present invention, there is provided a charging and discharging control device for controlling charging and discharging of a secondary battery connected to a load of a moving object which receives a supply of power from an overhead line and generates regenerative power, the charging and discharging control device including: a first limit current calculation unit configured to acquire load power which is required power or regenerative power in the load and a charge voltage of the secondary battery and obtain a first limit current for determining a limit of an adjustment current which is a setting value for controlling the charging and discharging of the secondary battery according to the load power based on the acquired load power and charge voltage; a limit current setting unit configured to set a limit value of the adjustment current according to the load power within a range of a second limit current for determining the limit of the adjustment current based on the performance of the secondary battery based on the first limit current obtained by the first limit current calculation unit; an adjustment logic determination unit configured to determine a relationship of the adjustment current corresponding to a state of charge (SOC) of the secondary battery in a range that does not exceed the limit value of the adjustment current based on the limit value of the adjustment current set by the limit current setting unit and a set SOC target value of the secondary battery; and an adjustment current determination unit configured to determine the adjustment current corresponding to the SOC of the secondary battery based on the relationship determined by the adjustment logic determination unit.

Thereby, according to load power of a vehicle, the charging and discharging control device can control the charging/discharging of the secondary battery and efficiently use power in the vehicle. In addition, it is possible to prevent the performance of the secondary battery from being deteriorated by determining limit values (upper and lower limit values) of the SOC adjustment current within the range of the second limit current set based on the performance of the secondary battery.

In addition, the charging and discharging control device can control the power amount of charging/discharging for the secondary battery within the range of the limit values (upper and lower limit values) of the SOC adjustment current according to the SOC of the secondary battery.

According to a second aspect of the present invention, in the first aspect of the present invention, the charging and discharging control device further includes: an SOC target value setting unit configured to set the SOC target value of the secondary battery.

According to a third aspect of the present invention, in the second aspect of the present invention, the SOC target value setting unit sets the SOC target value predetermined according to a travel route of the moving object based on position information representing a current position of the moving object.

Thereby, it is possible to adjust the SOC of the secondary battery according to the travel route.

According to a fourth aspect of the present invention, in any one of the first to third aspects of the present invention, the adjustment logic determination unit determines at least one of a relationship in which the adjustment power is increased to the limit value with an increase of the SOC of the secondary battery in a range from the SOC target value to a maximum value of the SOC predetermined according to the secondary battery and a relationship in which the adjustment power is decreased to the limit value with a decrease of the SOC of the secondary battery in a range from the SOC target value to a minimum value of the SOC predetermined according to the secondary battery.

According to a fifth aspect of the present invention, in any one of the first to fourth aspects of the present invention, the limit current setting unit compares an absolute value of the second limit current to an absolute value of the first limit current, and sets a smaller value as the limit value of the adjustment current.

According to a sixth aspect of the present invention, in any one of the first to fifth aspects of the present invention, the charging and discharging control device further includes: an adjustment current control unit configured to control power amounts of charging and discharging from the secondary battery based on the adjustment current determined by the adjustment current determination unit.

According to a seventh aspect of the present invention, in the sixth aspect of the present invention, the adjustment current control unit inhibits the discharging from the secondary battery if the SOC of the secondary battery is less than or equal to the SOC target value when the moving object is in a powering state and inhibits the charging to the secondary battery if the SOC of the secondary battery is greater than or equal to the SOC target value when the moving object is in a regenerative state.

According to an eighth aspect of the present invention, there is provided a charging and discharging control system including: the charging and discharging control device according to any one of the first to seventh aspects; the secondary battery; a motor configured to operate the moving object by receiving the supply of the required power and generate the regenerated power; and a direct current (DC)-DC converter connected between the overhead line and the secondary battery and between the motor and the secondary battery and configured to convert a voltage of the power supplied from the overhead line and the motor and a voltage of the power supplied from the secondary battery.

According to a ninth aspect of the present invention, there is provided a charging and discharging control method of controlling charging and discharging of a secondary battery connected to a load of a moving object which receives a supply of power from an overhead line and generates regenerative power, the charging and discharging control method comprising the steps of: acquiring load power which is required power or regenerative power in the load and a charge voltage of the secondary battery; obtaining a first limit current for determining a limit of an adjustment current which is a setting value for controlling the charging and discharging of the secondary battery according to the load power based on the acquired load power and charge voltage; setting a limit value of the adjustment current according to the load power within a range of a second limit current for determining the limit of the adjustment current based on the performance of the secondary battery based on the obtained first limit current; determining a relationship of the adjustment current corresponding to an SOC of the secondary battery in a range that does not exceed the limit value of the adjustment current based on the set limit value of the adjustment current and a set SOC target value of the secondary battery; and determining the adjustment current corresponding to the SOC of the secondary battery based on the determined relationship.

According to a tenth aspect of the present invention, there is provided a program for causing a computer to execute the procedures of: for controlling charging and discharging of a secondary battery connected to a load of a moving object which receives a supply of power from an overhead line and generates regenerative power, acquiring load power which is required power or regenerative power in the load and a charge voltage of the secondary battery; obtaining a first limit current for determining a limit of an adjustment current which is a setting value for controlling the charging and discharging of the secondary battery according to the load power based on the acquired load power and charge voltage; setting a limit value of the adjustment current according to the load power within a range of a second limit current for determining the limit of the adjustment current based on the performance of the secondary battery based on the obtained first limit current; determining a relationship of the adjustment current corresponding to an SOC of the secondary battery in a range that does not exceed the limit value of the adjustment current based on the set limit value of the adjustment current and a set SOC target value of the secondary battery; and determining the adjustment current corresponding to the SOC of the secondary battery based on the determined relationship.

Advantageous Effects of Invention

According to the charging and discharging control device, the charging and discharging control system, the charging and discharging control method, and the program described above, it is possible to efficiently use power in a moving object in which powering and regeneration are performed.

DESCRIPTION OF EMBODIMENTS

First Embodiment

Figure 1:
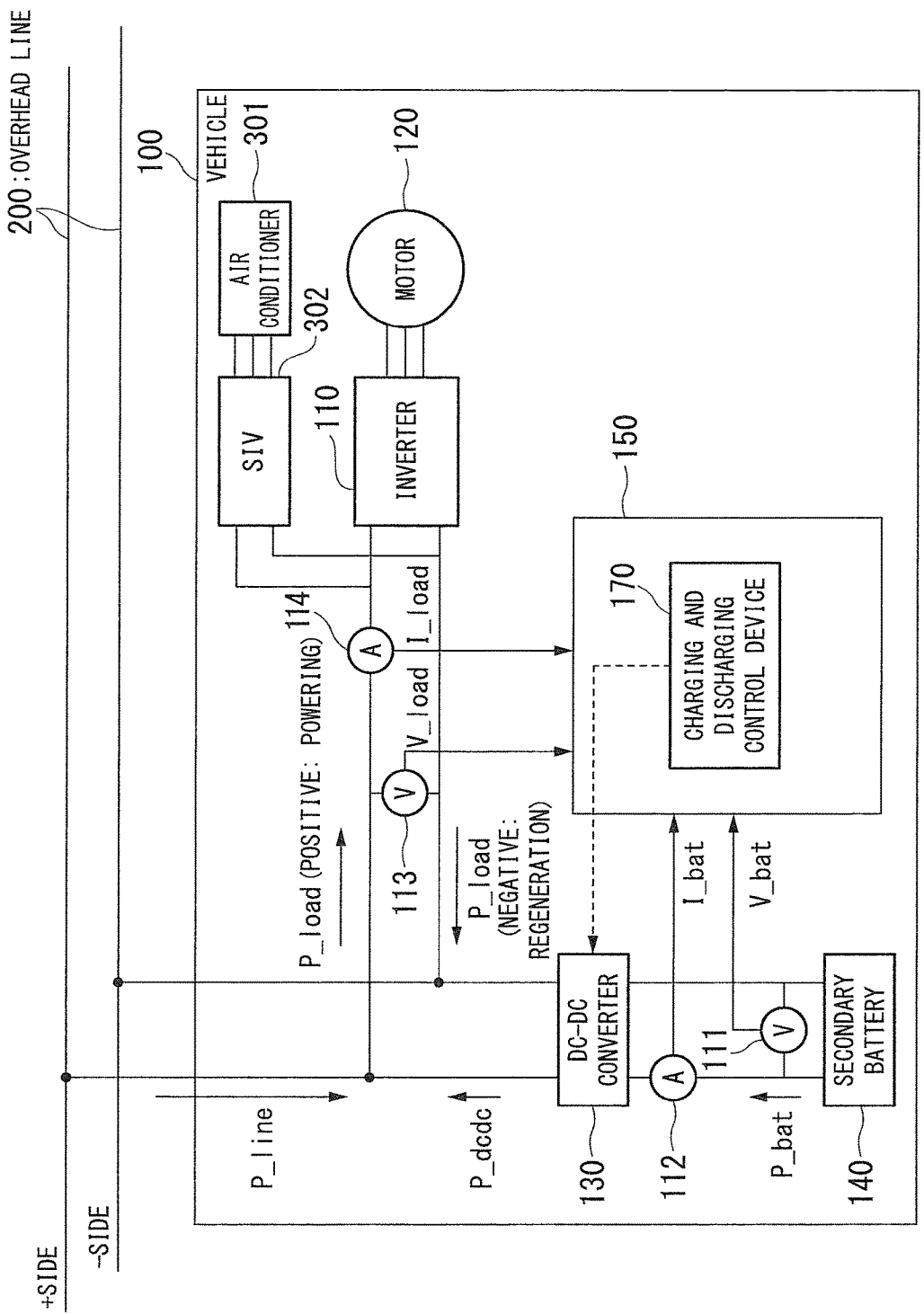
FIG. 1 is a block diagram illustrating an example of a configuration of a charging and discharging control system according to an embodiment of the present invention.

FIG. 1 is a schematic block diagram illustrating an example of a configuration of a charging and discharging control system according to the first embodiment of the present invention. In this embodiment, the charging and discharging control system, for example, is a system with which a vehicle 100 such as an electric train is equipped. Also, the charging and discharging control system according to this embodiment is not limited to the vehicle 100, and can be provided in other moving objects.

The vehicle 100 according to this embodiment includes an inverter 110, a motor 120, which is a load, a DC-DC converter 130, a secondary battery 140, and a central processing unit (CPU) 150. The CPU 150 is a control device including the charging and discharging control device 170.

First, connection relationships between devices will be described.

The secondary battery 140 is connected to an overhead line 200 via the DC-DC converter 130. A voltmeter 111 and an ammeter 112 are connected to an electric wire which connects the secondary battery 140 and the DC-DC converter 130. Also, hereinafter, a voltage detected by the voltmeter 111 is referred to as a charge voltage V_bat. In addition, the ammeter 112 is connected to a + terminal side. Hereinafter, a current detected by the ammeter 112 is referred to as a charge current I_bat. Also, a product of the charge voltage V_bat and the charge current I_bat is referred to as charge power P_bat.

In addition, the inverter 110 is connected to an electric wire which connects the overhead line 200 and the DC-DC converter 130. The voltmeter 113 and the ammeter 114 are connected to the electric wire for connecting the overhead line 200 and the DC-DC converter 130 and the electric wire for connecting the inverter 110. Hereinafter the voltage detected by the voltmeter 113 is referred to as a load voltage V_load. The ammeter 112 is connected to a + terminal side. Hereinafter, a current detected by the ammeter 112 is referred to as a load current I_load. A product of the load voltage V_load and the load current I_load is referred to as load power P_load.

In this embodiment, because power from the overhead line 200 or the secondary battery 140 is supplied to the inverter 110 when the vehicle 100 is in the powering state, the load power P_load becomes a positive value. On the other hand, because power generated by the motor 120 is supplied to the overhead line 200 or the secondary battery 140 when the vehicle 100 is in the regenerative state, the load power P_load becomes a negative value.

The vehicle 100 according to this embodiment may be equipped with a load, for example, such as an air conditioner 301, in addition to the motor 120. This air conditioner 301 is connected to an electric wire for connecting the electric wire for connecting the overhead line 200 and the DC-DC converter 130 and the inverter 110 via a static inverter (SV).

Next, functions of the configurations will be described.

The inverter 110 converts DC power P_line supplied from the overhead line 200 and DC power P_dcdc supplied form the secondary battery 140 via the DC-DC converter 130 into alternating current (AC) power, and outputs the AC power to the motor 120. This inverter 110 converts regenerative power generated by the motor 120 into DC power P_load. This DC power P_load is supplied to the overhead line 200 or the secondary battery 140.

The motor 120 causes the vehicle 100 to be powered by the AC power obtained by the conversion of the inverter 110. The motor 120 performs regenerative braking of the vehicle 100 and generates regenerative power.

The DC-DC converter 130 converts a voltage of the power supplied from the overhead line 200 and the motor 120 and a voltage of the power supplied from the secondary battery 140. A voltage value of the side of the secondary battery 140 of the DC-DC converter 130 is controlled by the charging and discharging control device 170 included in the CPU 150.

The secondary battery 140 is connected to the overhead line 200 and the motor 120 via the DC-DC converter 130, and is charged with the power supplied from the overhead line 200 and the motor 120. The secondary battery 140 supplies the charge power to the motor 120 via the DC-DC converter 130.

The charging and discharging control device 170 is a device for controlling charging and discharging for the secondary battery 140.

Figure 2A:
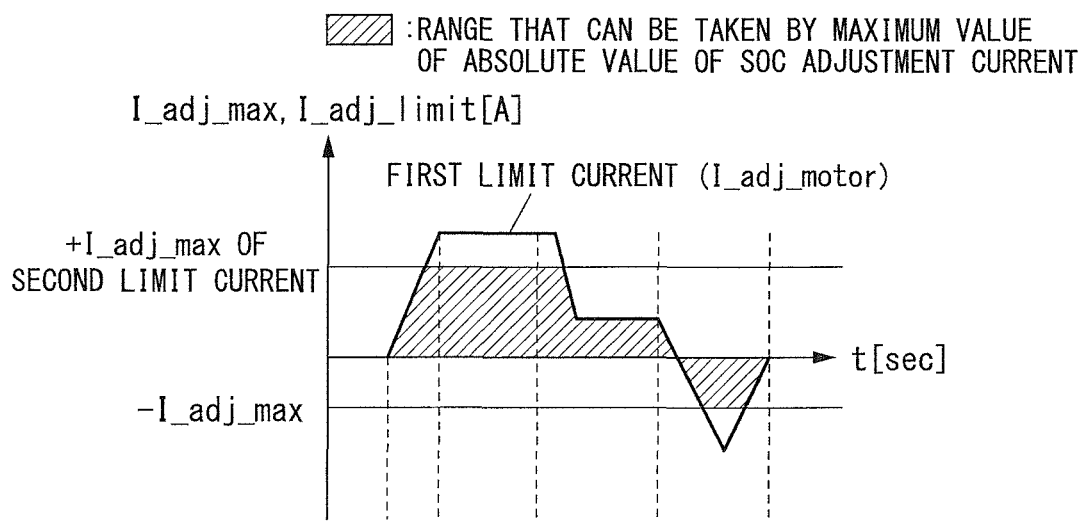
FIG. 2A is a diagram illustrating an example of charging and discharging control according to an embodiment of the present invention.
Figure 2B:
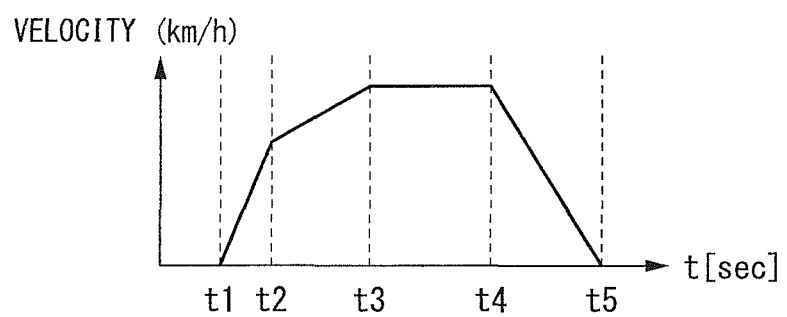
FIG. 2B is a diagram illustrating an example of charging and discharging control according to an embodiment of the present invention.

Next, with reference to FIGS. 2A and 2B, an example of charging and discharging control by the charging and discharging control device 170 according to this embodiment will be described. FIGS. 2A and 2B are diagrams illustrating an example of charging and discharging control according to this embodiment.

In FIG. 2A, a graph illustrating an example of an SOC adjustment current which varies with a travel route of the vehicle 100 is shown. The SOC adjustment current is a value for adjusting a power amount of charging/discharging of the secondary battery 140. In this embodiment, the charging and discharging control device 170 adjusts the power amount of the charging/discharging of the secondary battery 140 by controlling the voltage value of the side of the secondary battery 140 of the DC-DC converter 130 based on a set SOC adjustment current I_adj. That is, the SOC adjustment current I_adj is a setting value for controlling the charging/discharging of the secondary battery 140.

The lower graph illustrated in FIG. 2B includes a horizontal axis representing a time t [sec] and a vertical axis representing a velocity [km/h] and illustrates an example of a velocity of the vehicle 100 assumed according to the travel route of the vehicle 100. In this graph, the vehicle 100 is shown to be in the powering state in a period in which the vehicle increases and the vehicle 100 is shown to be in the regenerative state in a period in which the velocity decreases.

Also, this embodiment is not limited thereto. The horizontal axis representing a distance or a world coordinate value (latitude, longitude, or altitude) is taken and an SOC adjustment current I_adj, which varies with these values, also exhibits similar characteristics.

On the other hand, the upper graph illustrated in FIG. 2A includes a horizontal axis representing a time t [sec] and a vertical axis representing a current [A] and illustrates an example of a range that can be taken by a maximum value of an absolute value of an SCO adjustment current I_adj assumed according to the travel route of the vehicle 100. A broken line shown on the graph indicates a change in a first limit current I_adj_motor for determining a limit of the SOC adjustment current I_adj according to the load of the vehicle 100 including the motor 120, the air conditioner 301, or the like. That is, the first limit current I_adj_motor is an upper limit value of the SOC adjustment current I_adj determined according to the load power P_load.

In addition, in the vertical axis, a second limit current ±I_adj_max, which is a current for determining a limit of the SOC adjustment current I_adj based on the performance of the secondary battery 140, is shown. The second limit current ±I_adj_max is a limit value of the SOC adjustment current I_adj set based on the performance of the secondary battery 140, and, for example, is a limit value for preventing the performance from deteriorating according to performance characteristics of the secondary battery 140 which deteriorate according to a use period of the secondary battery 140. Also, I_adj_max is an upper limit value for determining the limit of a discharging time of the secondary battery 140. −I_adj_max is a lower limit value for determining the limit of a charging time of the secondary battery 140.

In the upper graph, a region indicated by a diagonal line is a range that can be taken by a maximum value of an absolute value of the SOC adjustment current I_adj. The region indicated by the diagonal line indicates that the first limit current I_adj_motor is a maximum value or a minimum value of the SOC adjustment current I_adj and the SOC adjustment current I_adj is set to a value within a range of the first limit current I_adj_motor when the absolute value of the first limit current I_adj_motor is less than the absolute value of the second limit current ±I_adj_max. On the other hand, when the absolute value of the first limit current I_adj_motor is greater than an absolute value of the second limit current ±I_adj_max, it is shown that the second limit current ±I_adj_max is the maximum value or the minimum value of the SOC adjustment current I_adj and the SOC adjustment current I_adj is set to a value within a range of the second limit current ±I_adj_max.

Here, the relationship of the graphs illustrated in FIGS. 2A and 2B will be described in detail. These graphs represent an example when the vehicle 100 runs through a predetermined travel route so that the vehicle 100 departs at time t1 and arrives at time t5.

The velocity rapidly increases from time t1 to time t2. At this time, because required power of the motor 120 increases, the first limit current I_adj_motor also increases. Then, the first limit current I_adj_motor is greater than or equal to the second limit current +I_adj_max in the middle. In this case, a range that can be taken by the maximum value of the SOC adjustment current I_adj is limited to within the second limit current +I_adj_max.

In addition, a state in which the velocity slowly increases from time t2 to time t3 is reached. At this time, because the motor 120 continuously requires power, the first limit current I_adj_motor also remains greater than or equal to the second limit current +I_adj_max.

Then, the velocity is fixed during a period from time t3 to time t4. At this time, because the required power of the motor 120 decreases, the first limit current I_adj_motor decreases and the first limit current I_adj_motor becomes less than or equal to the second limit current +I_adj_max in the middle. In this case, a range that can be taken by the maximum value of the SOC adjustment current I_adj is limited to within the first limit current I_adj_motor.

Next, during a period from time t4 to time t5, the velocity rapidly decreases and is set to 0 (zero). Here, the vehicle 100 is switched from the powering state to the regenerative state. Accordingly, the required power of the motor 120 is configured to decrease and the regenerative power is configured to increase. At this time, the first limit current I_adj_motor continuously decreases and decreases to 0 or less. In this case, a range that can be taken by the minimum value of the SOC adjustment current I_adj is limited to within the first limit current I_adj_motor. Thereafter, the first limit current I_adj_motor becomes less than or equal to the second limit current −I_adj_max. In this case, the range that can be taken by the minimum value of the SOC adjustment current I_adj is limited to within the second limit current −I_adj_max.

In this manner, the charging and discharging control device 170 according to this embodiment can determine limit values (an upper limit value and a lower limit value) of the SOC adjustment current I_adj according to the load power (required power and regenerative power) of the vehicle 100 within a range of the second limit current ±I_adj_max set based on the performance of the secondary battery 140 as illustrated in FIGS. 2A and 2B.

Consequently, according to the load power of the vehicle 100, it is possible to control charging/discharging of the secondary battery 140. Thereby, it is possible to efficiently use power in the vehicle 100.

In addition, it is possible to prevent the performance of the secondary battery 140 from deteriorating by determining the limit values (an upper limit value and a lower limit value) of the SOC adjustment current I_adj within the range of the second limit current ±I_adj_max set based on the performance of the secondary battery 140.

Figure 3:
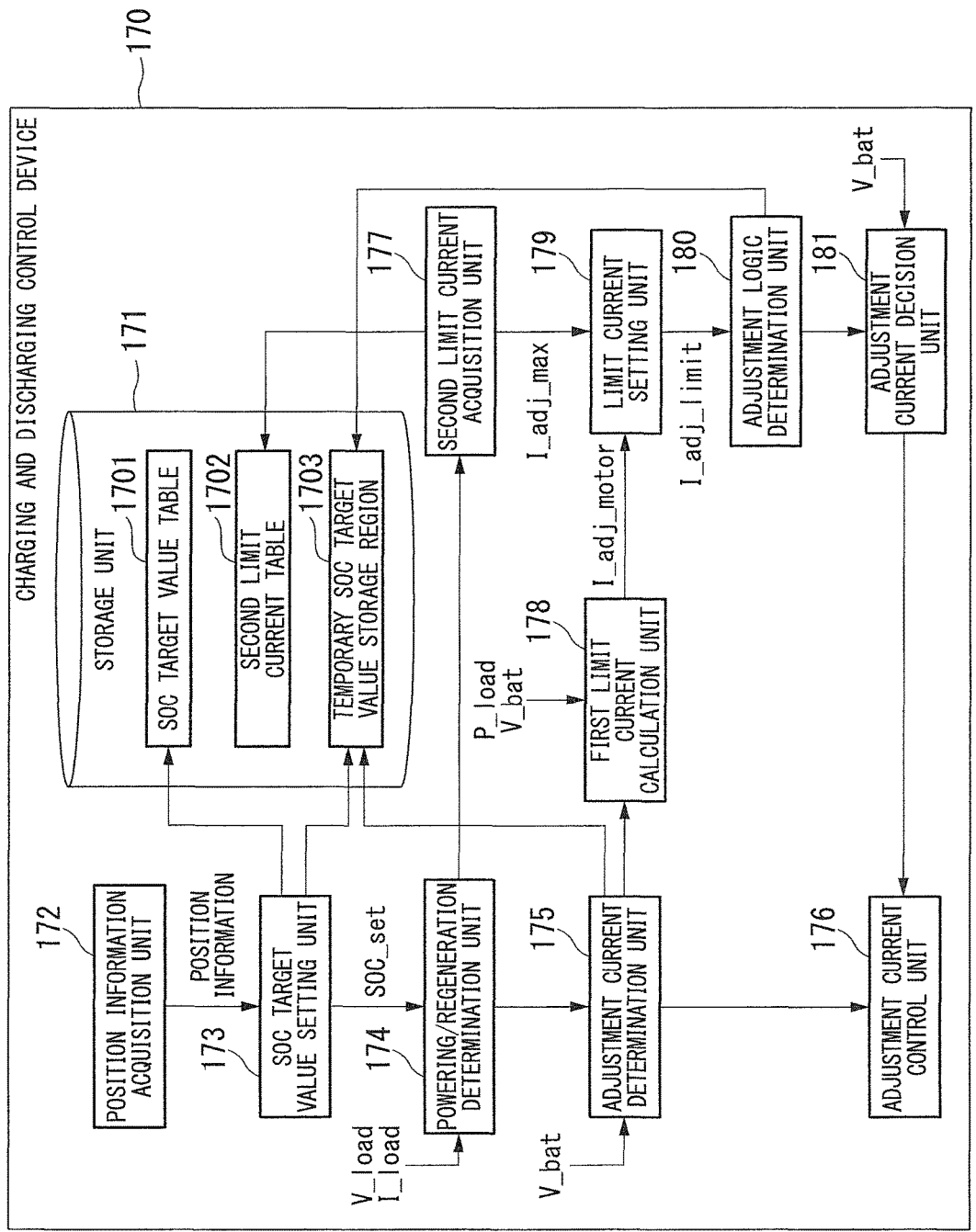
FIG. 3 is a block diagram illustrating an example of a configuration of the charging and discharging control device according to an embodiment of the present invention.

Next, with reference to FIG. 3, each configuration of the charging and discharging control device 170 will be described. FIG. 3 is a block diagram illustrating an example of a configuration of the charging and discharging control device 170 according to this embodiment.

As illustrated in FIG. 3, the charging and discharging control device 170 includes a storage unit 171, a position information acquisition unit 172, an SOC target value setting unit 173, a powering/regeneration determination unit 174, an adjustment current determination unit 175, an adjustment current control unit 176, a second limit current acquisition unit 177, a first limit current calculation unit 178, a limit current setting unit 179, an adjustment logic determination unit 180, and an adjustment current decision unit 181.

The storage unit 171 stores various information or programs to be used by the charging and discharging control device 170. This storage unit 171, for example, includes an SOC target value table 1701, a second limit current table 1702, and a temporary SOC target value storage region 1703.

The SOC target value table 1701 is a table in which position information indicating a current position of the vehicle 100 and an SOC target value predetermined according to the travel route of the vehicle 100 are associated. The SOC target value table 1701, for example, is a table in which kilometrage and an SOC target value are associated as shown in the following Table 1.

TABLE 1

|  | KILOMETRAGE | | | |
| --- | --- | --- | --- | --- |
|  | 100~200 | 200~300 | ... | 900~1000 |
| SOC TARGET VALUE (%) | 50 | 60 | ... | 30 |

The second limit current table 1702 is a table in which the second limit current +I_adj_max predetermined based on the performance of the secondary battery 140 is prescribed. In this second limit current table 1702, for example, the second limit current +I_adj_max predetermined according to a use period of the secondary battery 140 is prescribed.

The temporary SOC target value storage region 1703 is a storage region for temporarily storing an SOC target value set by the SOC target value setting unit 173.

The position information acquisition unit 172 acquires position information indicating a current position of the vehicle 100, and outputs the acquired position information to the SOC target value setting unit 173. This position information acquisition unit 172, for example, includes a reception unit configured to receive position information from a transmission device (not illustrated) installed on a line. In addition, the position information acquisition unit 172 may acquire the position information indicating a rough current position according to a travel time zone of the vehicle 100 or an elapsed time from a travel start point in time based on information stored in the storage unit 171.

The SOC target value setting unit 173 sets an SOC target value at a current point in time. The SOC target value setting unit 173 sets the SOC target value predetermined according to the travel route of the vehicle 100 based on the position information input from the position information acquisition unit 172. For example, the SOC target value setting unit 173 sets the SOC target value corresponding to the position information (kilometrage) input from the position information acquisition unit 172 by referring to the SOC target value table 1701. Also, this embodiment is not limited thereto, and the SOC target value setting unit 173, for example, may calculate the SOC target value based on the position information (for example, information indicating a travel distance from a start point) input from the position information acquisition unit 172 using a calculation formula for calculating the SOC target value predetermined according to the travel distance of the vehicle 100.

The SOC target value setting unit 173 writes the set SOC target value to the temporary SOC target value storage region 1703 of the storage unit 171.

The powering/regeneration determination unit 174 determines whether the vehicle 100 is in the powering state or the regenerative state based on the load power P_load. Also, the load power P_load is a name which collectively refers to necessary power required for powering by the motor 120 and power of regenerative power generated by the motor 120. This powering/regeneration determination unit 174 inputs a detection value of the voltmeter 113 and a detection value of the ammeter 114 and calculates (load voltage V_load×load current I_load=load voltage P_load) based on the input detection values. This powering/regeneration determination unit 174 determines the state as the powering state if the calculated load voltage P_load is a positive value and determines the state as the regenerative state if the calculated load voltage P_load is a negative value. The powering/regeneration determination unit 174 outputs information indicating the determination result to the adjustment current determination unit 175 and the second limit current acquisition unit 177.

The adjustment current determination unit 175 determines whether to execute charging/discharging control of the secondary battery 140 based on the determination result input from the powering/regeneration determination unit 174.

For example, when the state is the powering state, the adjustment current determination unit 175 determines whether an actually measured SOC value is less than or equal to the SOC target value. In this embodiment, the adjustment current determination unit 175 compares SOC_dstart, which is a value obtained by adding a predetermined value to the SOC target value, to the actually measured SOC value. When the actually measured SOC value is less than or equal to SOC_dstart, the adjustment current determination unit 175 determines that the adjustment current I_adj=0. That is, the adjustment current determination unit 175 determines that charging/discharging control is not performed.

When the state is the regenerative state, this adjustment current determination unit 175 determines whether the actually measured SOC value is greater than or equal to the SOC target value. Also, in this embodiment, the adjustment current determination unit 175 compares SOC_cstart, which is a value obtained by subtracting a predetermined value from the SOC target value, to the actually measured SOC value. When the actually measured SOC value is greater than or equal to SOC_cstart, the adjustment current determination unit 175 determines that the adjustment current I_adj=0. That is, the adjustment current determination unit 175 determines that the charging/discharging control is not performed.

When the charging/discharging control is not performed, the adjustment current determination unit 175 sets the adjustment current I_adj=0 in the adjustment current control unit 176.

Also, control in the adjustment current determination unit 175 is easily represented by mathematical formulas as follows.

In the case of (i-1)

Load voltage P_load≥0 (powering state) and actually measured SOC value≤SOC_dstart In the case of (i-2)

Load voltage P_load<0 (powering state) and actually measured SOC value≥SOC_cstart That is, in the case of (i-1) or (i-2), the adjustment current determination unit 175 determines that the charging/discharging control is not performed, and controls the DC-DC converter 130 so that a voltage value of the side of the secondary battery 140 of the DC-DC converter 130 matches a value of a charge voltage V_bat.

In addition, when the state is the powering state and the actually measured SOC value is greater than SOC_dstart, the adjustment current determination unit 175 determines that the discharging control is performed.

In addition, when the state is the regenerative state and the actually measured SOC value is less than SOC_cstart, the adjustment current determination unit 175 determines that the charging control is performed.

When it is determined that the discharging control or the charging control is performed, the adjustment current determination unit 175 instructs the first limit current calculation unit 178 to calculate the first limit current I_adj_motor.

The adjustment current control unit 176 controls the charging/discharging of the secondary battery 140 according to the set SOC adjustment current I_adj.

The adjustment current control unit 176 inhibits the discharging from the secondary battery 140 if the SOC of the secondary battery 140 is less than or equal to the SOC target value when the vehicle 100 is in the powering state, and inhibits the charging for the secondary battery 140 if the SOC of the secondary battery 140 is greater than or equal to the SOC target value when the vehicle 100 is in the regenerative state. For example, when the SOC adjustment current I_adj=0, the adjustment current control unit 176 controls the DC-DC converter 130 so that the voltage value of the side of the secondary battery 140 of the DC-DC converter 130 matches the charge voltage V_bat so as to prevent the charging/discharging control of the secondary battery 140 from being performed.

In addition, when the SOC adjustment current I_adj is the positive value, the adjustment current control unit 176 controls the DC-DC converter 130 so that the voltage value of the side of the secondary battery 140 of the DC-DC converter 130 is less than the charge voltage V_bat so as to perform the discharging control of the secondary battery 140. On the other hand, when the SOC adjustment current I_adj is the negative value, the adjustment current control unit 176 controls the DC-DC converter 130 so that the voltage value of the side of the secondary battery 140 of the DC-DC converter 130 is greater than the charge voltage V_bat so as to perform the charging control of the secondary battery 140.

The second limit current acquisition unit 177 reads the second limit current ±I_adj_max according to a use period of the secondary battery 140 by referring to the second limit current table 1702 stored in the storage unit 171. The second limit current acquisition unit 177 outputs the read second limit current ±I_adj_max to the limit current setting unit 179. Also, although not illustrated, an output value of a timer, a clock unit, or the like is input to the second limit current acquisition unit 177, and the second limit current acquisition unit 177 can acquire the use period from a use start time-point of the secondary battery 140 based on the input current time.

When there is an instruction to calculate the first limit current I_adj_motor from the adjustment current determination unit 175, the first limit current calculation unit 178 calculates the first limit current I_adj_motor based on the load power P_load and the charge voltage V_bat.

The first limit current calculation unit 178 calculates (load voltage V_load×load current I_load=load voltage P_load) based on the detection value of the voltmeter 113 and the detection value of the ammeter 114. The first limit current calculation unit 178 calculates the first limit current I_adj_motor according to the following Formula (1) based on the charge voltage V_bat, which is the detection value of the voltmeter 111, and the calculated load power P_load.

[Math. 1]

$$I\_adj\_motor = \begin{cases} \dfrac{P\_load}{\eta \cdot V\_bat} & (P\_load \geq 0) \\ \dfrac{P\_load \cdot \eta}{V\_bat} & (P\_load < 0) \end{cases} \quad \text{Formula (1)}$$

Also, η is DC-DC converter efficiency of the DC-DC converter 130.

The limit current setting unit 179 sets the limit value of the SOC adjustment current I_adj according to the load power within the range of the second limit current ±I_adj_max based on the first limit current I_adj_motor obtained by the first limit current calculation unit 178. In this embodiment, the limit current setting unit 179 compares an absolute value of the first limit current I_adj_motor input from the first limit current calculation unit 178 to an absolute value of the second limit current I_adj_max input from the second limit current acquisition unit 177 sets the smaller value as the limit value of the SOC adjustment current I_adj. In the case of the powering state, the limit current setting unit 179 sets the smaller value between the absolute values as an upper limit value I_adj_limit of the SOC adjustment current I_adj. On the other hand, in the case of the regenerative state, the limit current setting unit 179 sets the smaller value between the absolute values as a lower limit value –I_adj_limit of the SOC adjustment current I_adj. This limit current setting unit 179 outputs the set upper or lower limit value to the adjustment logic determination unit 180.

The adjustment logic determination unit 180 determines the adjustment logic based on the limit value ±I_adj_limit of the SOC adjustment current I_adj set by the limit current setting unit 179 and the SOC target value stored in the temporary SOC target value storage region 1703 of the storage unit 171. Also, the adjustment logic is a relationship of the SOC adjustment current I_adj corresponding to SOC [%] of the secondary battery 140 and is a function for calculating the SOC adjustment current I_adj based on SOC [%] in this embodiment.

The adjustment current decision unit 181 calculates the SOC adjustment current I_adj corresponding to SOC [%] based on the adjustment logic set by the adjustment logic determination unit 180.

Next, with reference to FIGS. 4 and 5, an example of the adjustment logic to be determined by the adjustment logic determination unit 180 will be described.

Figure 4:
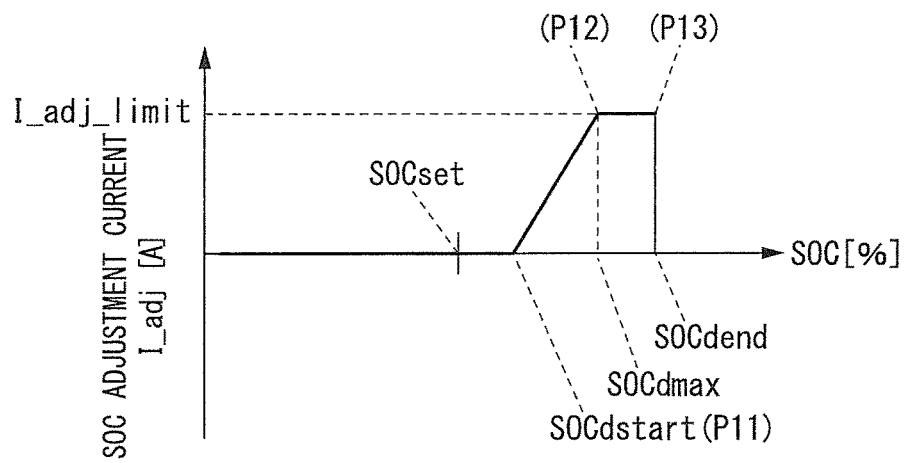
FIG. 4 is a graph illustrating an example of an adjustment logic to be determined in a powering state according to an embodiment of the present invention.

FIG. 4 is a graph illustrating an example of an adjustment logic to be determined in the powering state. The graph illustrated in FIG. 4 includes a horizontal axis representing an SOC [%] and a vertical axis representing an SOC adjustment current I_adj, and represents a function of the adjustment logic to be determined in the powering state. This adjustment logic indicates that SOC adjustment current I_adj=0 when it is less than or equal to SOC_dstart (hereinafter referred to as an adjustment discharging start SOC_dstart) which is a value obtained by adding a predetermined value to SOC_set which is an SOC target value.

Here, in the graph of FIG. 4, a point at which SOC adjustment current I_adj=0 and SOC=adjustment discharging start SOC_dstart is denoted by P11. In addition, a point at which maximum adjustment discharging SOC_dmax, which is a value obtained by adding a predetermined value to the adjustment discharging start SOC_dstart, is orthogonal to the upper limit value I_adj_limit is denoted by P12. In this case, the adjustment logic is indicated by a straight line connecting the point P11 and the point P12.

Also, a maximum SOC of the secondary battery 140 is predetermined to maintain the performance of the secondary battery 140. In the graph of FIG. 4, the maximum SOC is set as an adjustment discharging end SOC_dend. A point at which SOC adjustment current I_adj=upper limit value I_adj_limit and SOC=adjustment discharging end SOC_dend is denoted by P13. In this case, the adjustment logic is indicated by a straight line connecting the point P12 and the point P13.

In this manner, in this embodiment, the adjustment logic of the powering state is a relation function indicating a relation in which a value of the calculated SOC adjustment current I_adj_increases to the upper limit value I_adj_limit of the SOC adjustment current I_adj with an increase of SOC in a range from the SOC target value SOC_set to the maximum SOC (adjustment discharging end SOC_dend). Also, in this embodiment, the adjustment logic is a function in which the value of the calculated SOC adjustment current I_adj_increases from 0 to the upper limit value I_adj_limit of the SOC adjustment current I_adj according to a linear function (linearly) in a range from the adjustment discharging start SOC_dstart to the adjustment discharging end SOC_dmax. In this manner, it is possible to reduce switching loss by setting the adjustment discharging start SOC_dstart to a threshold value in which the SOC adjustment current I_adj=0 is lost, that is, a value having a greater margin than the SOC target value.

In the adjustment logic determination unit 180, an addition value for the SOC target value for calculating the adjustment discharging start SOC_dstart and the maximum adjustment discharging SOC_dmax is preset. In addition, in the adjustment logic determination unit 180, the adjustment discharging end SOC_dend is also preset according to the secondary battery 140. Consequently, the adjustment logic determination unit 180 can determine the adjustment logic based on the SOC target value and the upper limit value I_adj_limit of the SOC adjustment current I_adj. The adjustment logic determination unit 180 may determine the addition value for the SOC target value set to calculate the adjustment discharging start SOC_dstart and the maximum adjustment discharging SOC_dmax and the adjustment discharging end SOC_dend by referring to the table according to the SOC target value. This table is a table in which the addition value or the adjustment discharging end SOC_dend determined according to the SOC target value is prescribed.

Figure 5:
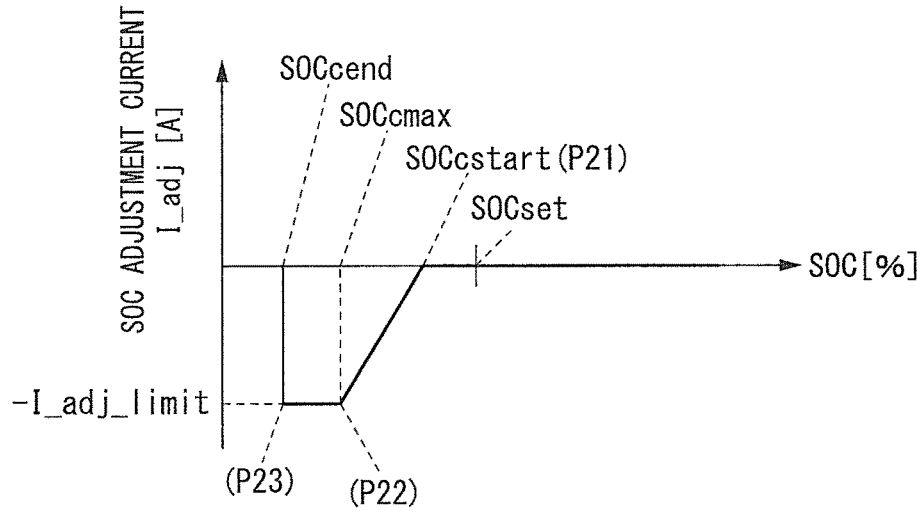
FIG. 5 is a graph illustrating an example of an adjustment logic to be determined in a regenerative state according to an embodiment of the present invention.

FIG. 5 is a graph illustrating an example of an adjustment logic to be determined in the regenerative state. The graph illustrated in FIG. 5 includes a horizontal axis representing an SOC [%] and a vertical axis representing an SOC adjustment current I_adj, and represents a function of the adjustment logic to be determined in the regenerative state. This adjustment logic indicates that SOC adjustment current I_adj=0 when it is greater than or equal to SOC_cstart (hereinafter referred to as an adjustment charging start SOC_cstart) which is a value obtained by subtracting a predetermined value from SOC_set which is an SOC target value.

Here, in the graph of FIG. 5, a point at which SOC adjustment current I_adj=0 and SOC=adjustment charging start SOC_cstart is denoted by P21. A point at which minimum adjustment charging SOC_cmax, which is a value obtained by subtracting a predetermined value from the adjustment charging start SOC_cstart, is orthogonal to the lower limit value −I_adj_limit is denoted by P22. In this case, the adjustment logic is indicated by a straight line connecting the point P21 and the point P22.

A minimum SOC of the secondary battery 140 is predetermined to maintain the performance of the secondary battery 140. In the graph of FIG. 5, the minimum SOC is set as an adjustment charging end SOC_cend. A point at which SOC adjustment current I_adj=lower limit value −I_adj_limit and SOC=adjustment charging end SOC_cend is denoted by P23. In this case, the adjustment logic is indicated by a straight line connecting the point P22 and the point P23.

As described above, in this embodiment, the adjustment logic of the regenerative state is a relation function indicating a relation in which a value of the calculated SOC adjustment current I_adj decreases to the lower limit value −I_adj_limit of the SOC adjustment current I_adj with a decrease of SOC in a range from the SOC target value SOC_set to the minimum SOC (adjustment charging end SOC_cend). In this embodiment, the adjustment logic is a function in which the value of the calculated SOC adjustment current I_adj decreases from 0 to the lower limit value −I_adj_limit of the SOC adjustment current I_adj according to a linear function (linearly) in a range from the adjustment charging start SOC_cstart to the adjustment charging end SOC_cmax. In this manner, it is possible to reduce switching loss by setting the adjustment charging start SOC_cstart to a threshold value in which the SOC adjustment current I_adj=0 is lost, that is, a value having a greater margin than the SOC target value.

In the adjustment logic determination unit 180, a subtraction value for the SOC target value for calculating the adjustment charging start SOC_cstart and the minimum adjustment charging SOC_cmax is preset. In the adjustment logic determination unit 180, the adjustment charging end SOC_cend is also preset according to the secondary battery 140. Consequently, the adjustment logic determination unit 180 can determine the adjustment logic based on the SOC target value and the lower limit value −I_adj_limit of the SOC adjustment current I_adj. The adjustment logic determination unit 180 may determine the subtraction value for the SOC target value set to calculate the adjustment charging start SOC_cstart and the minimum adjustment charging SOC_cmax and the adjustment charging end SOC_cend by referring to the table according to the SOC target value. This table is a table in which the subtraction value or the adjustment charging end SOC_cend determined according to the SOC target value is prescribed.

Figure 6:
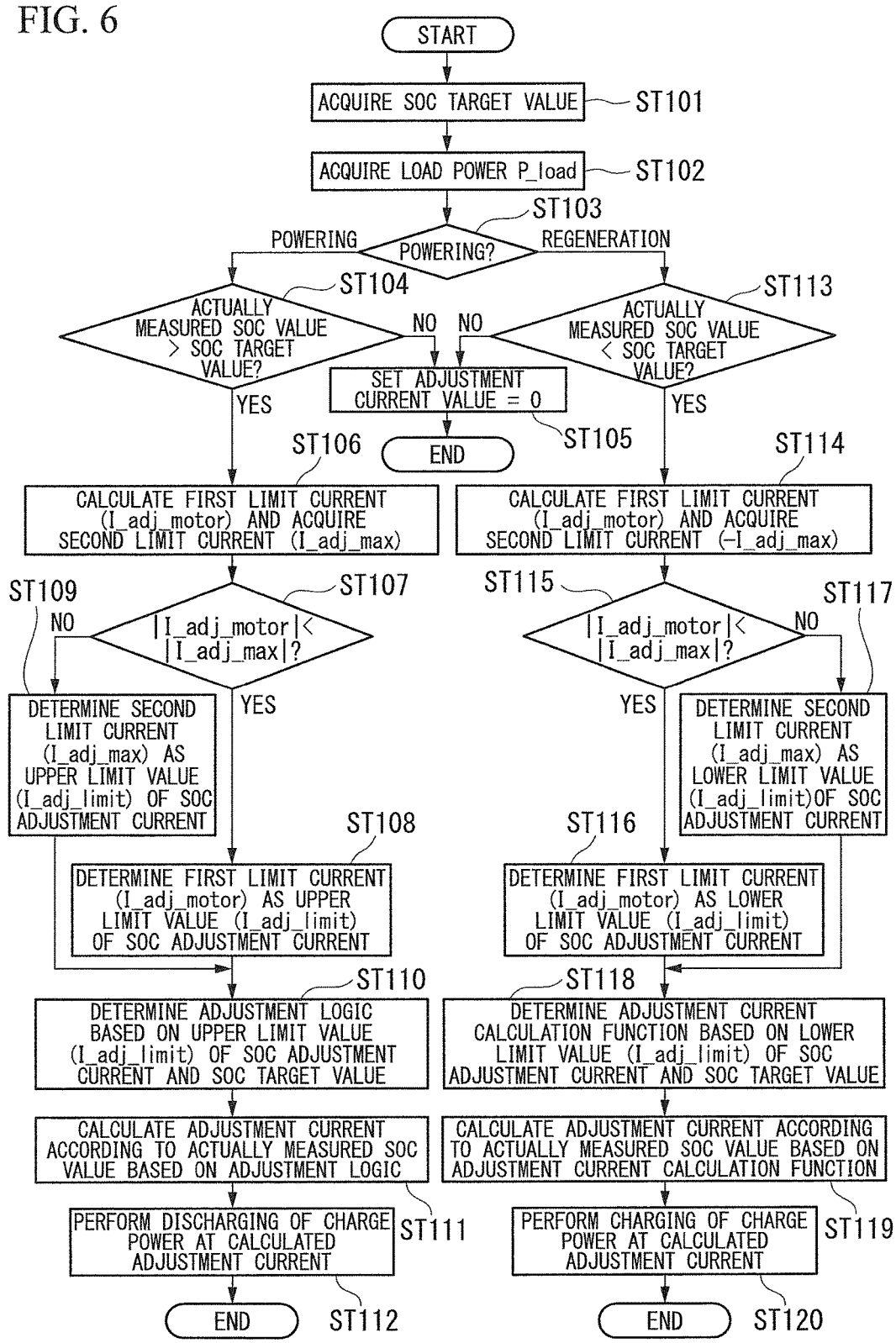
FIG. 6 is a flowchart illustrating an example of a charging and discharging control method according to an embodiment of the present invention.

Next, with reference to FIG. 6, an example of the charging and discharging control method according to this embodiment will be described. FIG. 6 is a flowchart illustrating the example of the charging and discharging control method according to this embodiment. Here, when a predetermined time has elapsed from a point in time at which a processing flow illustrated in FIG. 6 started, the charging and discharging control device 170 periodically iterates and executes this processing flow.

(Step ST101)

The charging and discharging control device 170 first acquires an SOC target value. In this embodiment, the SOC target value setting unit 173 of the charging and discharging control device 170 sets the SOC target value corresponding to kilometrage based on position information input from the position information acquisition unit 172, and writes the set SOC target value to the temporary SOC target value storage region.

(Step ST102)

Then, the charging and discharging control device 170 acquires load power P_load. In this embodiment, the powering/regeneration determination unit 174 of the charging and discharging control device 170 calculates (load voltage V_load×load current I_load=load voltage P_load) based on a detection value of the voltmeter 113 and a detection value of the ammeter 114.

(Step ST103)

Then, the charging and discharging control device 170 determines whether the vehicle 100 is in the powering state or the regenerative state. In this embodiment, the powering/regeneration determination unit 174 of the charging and discharging control device 170 determines whether the calculated load power P_load is a positive value or a negative value.

(Step ST104)

When the calculated load power P_load is the positive value, the powering/regeneration determination unit 174 determines that the state is the powering state.

Then, the charging and discharging control device 170 determines whether the actually measured SOC value is greater than the SOC target value by comparing the actually measured SOC value to the SOC target value. In this embodiment, the adjustment current determination unit 175 of the charging and discharging control device 170 determines whether the actually measured SOC value is greater than the adjustment discharging start SOC_dstart.

(Step ST105)

When the actually measured SOC value is less than or equal to the adjustment discharging start SOC_dstart [actually measured SOC value≤SOC_dstart], the adjustment current determination unit 175 determines that adjustment current I_adj=0. That is, the adjustment current determination unit 175 determines that the charging/discharging control is not performed. Consequently, the adjustment current control unit 176 controls a voltage value of the side of the secondary battery 140 of the DC-DC converter 130 so that charge/discharge power=0 for the secondary battery 140.

(Step ST106)

On the other hand, when the actually measured SOC value is greater than the adjustment discharging start SOC_dstart [actually measured SOC value>SOC_dstart], the charging and discharging control device 170 determines the upper limit value of the SOC adjustment current I_adj according to the load power (required power and regenerative power) of the vehicle 100 within the range of the second limit current I_adj_max. This process corresponds to steps ST106 to ST109.

First, the charging and discharging control device 170 calculates the first limit current I_adj_motor based on the load power P_load and the charge voltage V_bat. In this embodiment, the first limit current calculation unit 178 of the charging and discharging control device 170 calculates the first limit current I_adj_motor by substituting the load voltage P_load and the charge voltage V_bat into the above-described Formula (1), and outputs the calculated first limit current I_adj_motor to the limit current setting unit 179.

In addition, the charging and discharging control device 170 acquires the second limit current I_adj_max. In this embodiment, the second limit current acquisition unit 177 of the charging and discharging control device 170 reads the second limit current I_adj_max according to a use period of the secondary battery 140 by referring to the second limit current table 1702 of the storage unit 171, and outputs the read second limit current I_adj_max to the limit current setting unit 179.

(Step ST107)
Then, the limit current setting unit 179 compares an absolute value of the first limit current I_adj_motor input from the first limit current calculation unit 178 to an absolute value of the second limit current I_adj_max input from the second limit current acquisition unit 177 and determines whether the absolute value of the first limit current I_adj_motor is less than the absolute value of the second limit current I_adj_max.

(Step ST108)
When the absolute value of the first limit current I_adj_motor is less than the absolute value of the second limit current I_adj_max, the limit current setting unit 179 sets the first limit current I_adj_motor to the upper limit value I_adj_limit of the SOC adjustment current I_adj. Then, the limit current setting unit 179 outputs the set upper limit value I_adj_limit of the SOC adjustment current I_adj to the adjustment logic determination unit 180.

(Step ST109)
On the other hand, when the absolute value of the first limit current I_adj_motor is greater than or equal to the absolute value of the second limit current I_adj_max, the limit current setting unit 179 sets the second limit current I_adj_max to the upper limit value I_adj_limit of the SOC adjustment current I_adj. Then, the limit current setting unit 179 outputs the set upper limit value I_adj_limit of the SOC adjustment current I_adj to the adjustment logic determination unit 180.

(Step ST110)
Then, the charging and discharging control device 170 determines an adjustment logic based on the set upper limit value I_adj_limit of the SOC adjustment current I_adj and the SOC target value. In this embodiment, the adjustment logic determination unit 180 of the charging and discharging control device 170 determines the adjustment logic based on the upper limit value I_adj_limit of the SOC adjustment current I_adj set by the limit current setting unit 179 and the SOC target value stored in the temporary SOC target value storage region 1703 of the storage unit 171.

(Step ST111)
Then, the charging and discharging control device 170 calculates the SOC adjustment current I_adj according to the actually measured SOC value of the secondary battery 140 based on the determined adjustment logic. In this embodiment, first, the adjustment current decision unit 181 of the charging and discharging control device 170 calculates the actually measured SOC value of the secondary battery 140 based on the charge voltage V_bat measured by the voltmeter 111. Then, the adjustment current decision unit 181 calculates the SOC adjustment current I_adj corresponding to the actually measured SOC value of the secondary battery 140 in the adjustment logic determined by the adjustment logic determination unit 180. The adjustment current decision unit 181 outputs the calculated SOC adjustment current I_adj to the adjustment current control unit 176.

(Step ST112)
Then, the charging and discharging control device 170 controls the charging/discharging of the secondary battery 140 based on the calculated SOC adjustment current I_adj. In this embodiment, the adjustment current control unit 176 of the charging and discharging control device 170 performs the discharging control for supplying the charge power from the secondary battery 140 to the motor 120 via the inverter 110 by controlling the voltage value of the side of the secondary battery 140 of the DC-DC converter 130 based on the SOC adjustment current I_adj input from the adjustment current decision unit 181. In other words, the adjustment current control unit 176 controls the voltage value of the secondary battery 140 of the DC-DC converter 130 so that the current value detected by the ammeter 112 becomes the SOC adjustment current I_adj.

(Step ST113)
On the other hand, the powering/regeneration determination unit 174 determines that the state is the regenerative state when the calculated load power P_load is the negative value in step ST103.

Then, the charging and discharging control device 170 determines whether the actually measured SOC value is greater than the SOC target value by comparing the actually measured SOC value to the SOC target value. In this embodiment, the adjustment current determination unit 175 of the charging and discharging control device 170 determines whether the actually measured SOC value is less than the adjustment charging start SOC_cstart.

(Step ST105)
When the actually measured SOC value is greater than or equal to the adjustment charging start SOC_cstart [actually measured SOC value SOC_cstart], the adjustment current determination unit 175 determines that adjustment current I_adj=0. That is, the adjustment current determination unit 175 determines that the charging/discharging control is not performed. Consequently, the adjustment current control unit 176 controls a voltage value of the side of the secondary battery 140 of the DC-DC converter 130 so that charge/discharge power=0 for the secondary battery 140.

(Step ST114)
On the other hand, when the actually measured SOC value is less than or equal to the adjustment charging start SOC_cstart [actually measured SOC value<SOC_cstart], the charging and discharging control device 170 determines a lower limit value of the SOC adjustment current I_adj according to the load power (required power and regenerative power) of the vehicle 100 within the range of the second limit current −I_adj_max. This process corresponds to steps ST115 to ST117.

Briefly, the first limit current calculation unit 178 calculates the first limit current I_adj_motor by substituting the load voltage P_load and the charge voltage V_bat into the above-described Formula (1), and outputs the calculated first limit current I_adj_motor to the limit current setting unit 179. In addition, the second limit current acquisition unit 177 reads the second limit current −I_adj_max according to a use period of the secondary battery 140 by referring to the second limit current table 1702 of the storage unit 171, and outputs the read second limit current −I_adj_max.

(Step ST115)

Then, the limit current setting unit 179 compares an absolute value of the first limit current I_adj_motor input from the first limit current calculation unit 178 to an absolute value of the second limit current −I_adj_max input from the second limit current acquisition unit 177 and determines whether the absolute value of the first limit current I_adj_motor is less than the absolute value of the second limit current −I_adj_max.

(Step ST116)

When the absolute value of the first limit current I_adj_motor is less than the absolute value of the second limit current −I_adj_max, the limit current setting unit 179 sets the first limit current I_adj_motor to the lower limit value −I_adj_limit of the SOC adjustment current I_adj. Then, the limit current setting unit 179 outputs the set lower limit value −I_adj_limit of the SOC adjustment current I_adj to the adjustment logic determination unit 180.

(Step ST117)

On the other hand, when the absolute value of the first limit current I_adj_motor is greater than or equal to the absolute value of the second limit current −I_adj_max, the limit current setting unit 179 sets the second limit current I_adj_max to the lower limit value −I_adj_limit of the SOC adjustment current I_adj. Then, the limit current setting unit 179 outputs the set lower limit value −I_adj_limit of the SOC adjustment current I_adj to the adjustment logic determination unit 180.

(Step ST118)

Then, the charging and discharging control device 170 determines an adjustment logic based on the set lower limit value −I_adj_limit of the SOC adjustment current I_adj and the SOC target value. In this embodiment, the adjustment logic determination unit 180 of the charging and discharging control device 170 determines the adjustment logic based on the lower limit value −I_adj_limit of the SOC adjustment current I_adj set by the limit current setting unit 179 and the SOC target value stored in the temporary SOC target value storage region 1703 of the storage unit 171.

(Step ST119)

Then, the adjustment current decision unit 181 of the charging and discharging control device 170 calculates the SOC adjustment current I_adj based on the determined adjustment logic, and outputs the calculated SOC adjustment current I_adj to the adjustment current control unit 176.

(Step ST120)

Then, the adjustment current control unit 176 of the charging and discharging control device 170 performs the charging control for charging the secondary battery 140 with regenerative power supplied from the motor 120 via the inverter 110 by controlling the voltage value of the DC-DC converter 130 based on the SOC adjustment current I_adj input from the adjustment current decision unit 181. In other words, the adjustment current control unit 176 controls the voltage value of the secondary battery 140 of the DC-DC converter 130 so that the current value detected by the ammeter 112 is set to the SOC adjustment current I_adj.

As described above, the charging and discharging control device 170 according to this embodiment determines limit values (an upper limit value and a lower limit value) of the SOC adjustment current I_adj according to the load power (required power and regenerative power) of the vehicle 100 within the range of the second limit current ±I_adj_max set based on the performance of the secondary battery 140. In addition, the charging and discharging control device 170 determines an SOC adjustment current I_adj corresponding to the actually measured SOC value of the secondary battery 140 using the adjustment logic determined based on the limit value of the SOC adjustment current I_adj.

Through this configuration, according to load power of the vehicle 100, the charging and discharging control device 170 can control the charging/discharging of the secondary battery 140 and efficiently use power in the vehicle 100. In addition, it is possible to prevent the performance of the secondary battery 140 from deteriorating by determining limit values (upper and lower limit values) of the SOC adjustment current I_adj within the range of the second limit current set ±I_adj_max set based on the performance of the secondary battery 140.

In addition, the charging and discharging control device 170 can control the power amount of the charging/discharging for the secondary battery 140 within the range of the limit values (upper and lower limit values) of the SOC adjustment current I_adj according to the SOC of the secondary battery 140.

Further, the SOC target value setting unit 173 can set the SOC target value according to kilometrage by referring to the SOC target value table 1701. In this manner, it is possible to reduce the processing load and shorten the processing time by a process of referring to a table as compared to a method of calculating the SOC target value by a calculation operation or the like. In addition, it is possible to adjust the SOC of the secondary battery 140 according to a travel route by setting the SOC target value according to a travel route indicated by the kilometrage or the like. This adjustment is particularly effective when the vehicle 100 is an electric train.

Also, embodiments according to the present invention are not limited to the above-described embodiment. For example, although an example in which the vehicle 100 is an electric train has been described, the present invention is not limited thereto. For example, the vehicle 100 may be an industrial device such as a crane truck or the like In addition, the charging and discharging control device 170 according to this embodiment internally has a computer system. Therefore, an operation process is stored in a computer-readable recording medium in the form of a program. The computer system reads and executes the program and the above-described process is performed. The "computer system" used here may include a CPU, various types of memories, an operating system (OS), and hardware such as peripheral devices.

In addition, the "computer system" is assumed to include a homepage providing environment (or displaying environment) when a World Wide Web (WWW) system is used.

In addition, each process may be performed by recording the program for implementing each step on the computer-readable recording medium, recording the program for implementing its function on the computer-readable recording medium, and causing the computer system to read and execute the program recorded on the recording medium.

In addition, the "computer-readable recording medium" refers to a storage apparatus, including a flexible disk, a magneto-optical disc, a read only memory (ROM), a writable non-volatile memory such as a flash memory, a portable medium such as a compact disc (CD)-ROM, and a hard disk embedded in the computer system.

Furthermore, the "computer-readable recording medium" is assumed to include a medium that holds a program for a constant period of time, such as a volatile memory (e.g., dynamic random access memory (DRAM)) inside a computer system serving as a server or a client when the program is transmitted via a network such as the Internet or a communication circuit such as a telephone circuit.

In addition, the above-described program may be transmitted from a computer system storing the program in a storage apparatus or the like via a transmission medium or transmitted to another computer system by transmission waves in a transmission medium. Here, the "transmission medium" for transmitting the program refers to a medium having a function of transmitting information, such as a network (communication network) like the Internet or a communication circuit (communication line) like a telephone circuit.

In addition, the above-described program may be a program for implementing some of the above-described functions.

Further, the above-described program may be a program, i.e., a so-called differential file (differential program), capable of implementing the above-described function in combination with a program already recorded on the computer system.

In addition, in the scope without departing from the subject matter of the present invention, it is possible to appropriately replace components in the above-described embodiment with well-known components. In addition, the technical scope of the invention is not limited to the above-mentioned embodiments, and various modifications can be made within the scope that does not depart from the subject matter of the invention.

INDUSTRIAL APPLICABILITY

According to the charging and discharging control device, the charging and discharging control system, the charging and discharging control method, and the program described above, it is possible to efficiently use power in a moving object in which powering and regeneration are performed.

REFERENCE SIGNS LIST

100 Vehicle
110 Inverter
120 Motor
130 DC-DC converter
140 Secondary battery
150 CPU
170 Charging and discharging control device
171 Storage unit
172 Position information acquisition unit
173 SOC target value setting unit
174 Powering/regeneration determination unit
175 Adjustment current determination unit
176 Adjustment current control unit
177 Second limit current acquisition unit
178 First limit current calculation unit
179 Limit current setting unit
180 Adjustment logic determination unit
181 Adjustment current decision unit

The invention claimed is:

1. A charging and discharging control device for controlling charging and discharging of a secondary battery connected to a load of a moving object which receives a supply of power from an overhead line and generates regenerative power, the charging and discharging control device comprising:

a first limit current calculation unit configured to acquire load power which is required power or regenerative power in the load and a charge voltage of the secondary battery and obtain a first limit current for determining a limit of an adjustment current which is a setting value for controlling the charging and discharging of the secondary battery according to the load power based on the acquired load power and charge voltage;

a limit current setting unit configured to set a limit value of the adjustment current to the first limit current when an absolute value of the first limit current obtained by the first limit calculation unit is less than an absolute value of a second limit current for determining the limit of the adjustment current based on the performance of the secondary battery, and to set a limit value of the adjustment current to the second limit current when the absolute value of the first limit current is greater than the absolute value of the second limit current;

an adjustment logic determination unit configured to determine a relationship of the adjustment current corresponding, to a state of charge (SOC) of the secondary battery in a range that does not exceed the limit value of the adjustment current based on the limit value of the adjustment current set by the limit current setting unit and a set SOC target value of the secondary battery; and an adjustment current determination unit configured to determine the adjustment current corresponding to the SOC of the secondary battery based on the relationship determined by the adjustment logic determination unit.

2. The charging and discharging control device according to claim 1, further comprising: an SOC target value setting unit configured to set the SOC target value of the secondary battery.

3. The charging and discharging control device according to claim 2, wherein the SOC target value setting unit sets the SOC target value predetermined according to a travel route of the moving object based on position information representing a current position of the moving object.

4. The charging and discharging control device according to claim 1, wherein the adjustment logic determination unit determines at least one of a relationship in which the adjustment current is increased to the limit value with an increase of the SOC of the secondary battery in a range from the SOC target value to a maximum value of the SOC predetermined according to the secondary battery and a relationship in which the adjustment current is decreased to the limit value with a decrease of the SOC of the secondary battery in a range from the SOC target value to a minimum value of the SOC predetermined according to the secondary battery.

5. The charging and discharging control device according to claim 1, wherein the limit current setting unit compares the absolute value of the second limit current to the absolute value of the first limit current, and sets a smaller value as the limit value of the adjustment current.

6. The charging and discharging control device according to claim 1, further comprising:

an adjustment current control unit configured to control power amounts of charging and discharging from the secondary battery based on the adjustment current determined by the adjustment current determination unit.

7. The charging and discharging control device according to claim 6, wherein the adjustment current control unit inhibits the discharging from the secondary battery if the SOC of the secondary battery is less than or equal to the SOC target value when the moving object is in a powering state and inhibits the charging to the secondary battery if the SOC of the secondary battery is greater than or equal to the SOC target value when the moving object is in a regenerative state.

8. A charging and discharging control system comprising:
the charging and discharging control device according to claim 1;
the secondary battery;
a motor configured to operate the moving object by receiving the supply of the required power and generate the regenerated power; and
a direct current (DC)-DC converter connected between the overhead line and the secondary battery and between the motor and the secondary battery and configured to convert a voltage of the power supplied from the overhead line and the motor and a voltage of the power supplied from the secondary battery.

9. A charging and discharging control method of controlling charging and discharging of a secondary battery connected to a load of a moving object which receives a supply of power from an overhead line and generates regenerative power, the charging and discharging control method comprising the steps of:
acquiring load power which is required power or regenerative power in the load and a charge voltage of the secondary battery;
obtaining a first limit current for determining a limit of an adjustment current which is a setting value for controlling the charging and discharging of the secondary battery according to the load power based on the acquired load power and charge voltage;
setting a limit value of the adjustment current to the first limit current when an absolute value of the obtained first limit current is less than an absolute value of a second limit current for determining the limit of the adjustment current based on the performance of the secondary battery, and to set a limit value of the adjustment current to the second limit current when the absolute value of the first limit current is greater than the absolute value of the second limit current;
determining a relationship of the adjustment current corresponding to an SOC of the secondary battery in a range that does not exceed the limit value of the adjustment current based on the set limit value of the adjustment current and a set SOC target value of the secondary battery; and
determining the adjustment current corresponding to the SOC of the secondary battery based on the determined relationship.

10. A non-transitory computer readable medium storing program for causing a computer to execute the procedures of:
for controlling charging and discharging of a secondary battery connected to a load of a moving object which receives a supply of power from an overhead line and generates regenerative power,
acquiring load power which is required power or regenerative power in the load and a charge voltage of the secondary battery;
obtaining a first limit current for determining a limit of an adjustment current which is a setting value for controlling the charging and discharging of the secondary battery according to the load power based on the acquired load power and charge voltage;
setting a limit value of the adjustment current to the first limit current when an absolute value of the obtained first limit current is less than an absolute value of a second limit current for determining the limit of the adjustment current based on the performance of the secondary battery, and to set a limit value of the adjustment current to the second limit current when the absolute value of the first limit current is greater than the absolute value of the second limit current;
determining a relationship of the adjustment current corresponding to an SOC of the secondary battery in a range that does not exceed the limit value of the adjustment current based on the set limit value of the adjustment current and a set SOC target value of the secondary battery; and
determining the adjustment current corresponding to the SOC of the secondary battery based on the determined relationship.

\* \* \* \* \*